(12) United States Patent
Manivannan et al.

(10) Patent No.: US 7,375,378 B2
(45) Date of Patent: May 20, 2008

(54) SURFACE PASSIVATED PHOTOVOLTAIC DEVICES

(75) Inventors: Venkatesan Manivannan, Rexford, NY (US); Abasifreke Udo Ebong, Marietta, GA (US); Jiunn-Ru Jeffrey Huang, Schenectady, NY (US); Thomas Paul Feist, Niskayuna, NY (US); James Neil Johnson, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 435 days.

(21) Appl. No.: 11/127,648

(22) Filed: May 12, 2005

(65) Prior Publication Data

US 2006/0255340 A1   Nov. 16, 2006

(51) Int. Cl.
*H01L 27/15* (2006.01)
*H01L 31/12* (2006.01)
*H01L 33/00* (2006.01)

(52) U.S. Cl. .................... 257/79; 257/85; 257/E33.001

(58) Field of Classification Search .................. 257/79, 257/80, 85, 94, 103, E33.001
See application file for complete search history.

(56) References Cited

U.S. PATENT DOCUMENTS

| | | | | |
|---|---|---|---|---|
| 4,782,376 | A * | 11/1988 | Catalano | 136/258 |
| 5,589,008 | A | 12/1996 | Keppner et al. | |
| 5,705,828 | A | 1/1998 | Noguchi et al. | |
| 6,150,603 | A | 11/2000 | Karam et al. | 136/252 |
| 2002/0063303 | A1 | 5/2002 | Pauchard et al. | |
| 2003/0145884 | A1 | 8/2003 | King et al. | |
| 2004/0261840 | A1 | 12/2004 | Schmit et al. | 136/258 |

FOREIGN PATENT DOCUMENTS

| | | |
|---|---|---|
| EP | 1 460 693 | 9/2004 |
| EP | 1 469 528 | 10/2004 |
| EP | 1489667 A2 | 12/2004 |

OTHER PUBLICATIONS

H. Plagwitz et al., "20%-Efficient Silicon Solar Cells with Local Contacts to the a-Si-Passivated Surfaces by Means of Annealing (Cosima)," (item 2BO.2.6 from conference agenda dated Jun. 7, 2005).

(Continued)

*Primary Examiner*—Hoai v Pham
(74) *Attorney, Agent, or Firm*—Fletcher Yoder

(57) ABSTRACT

A photovoltaic device comprising a photovoltaic cell is provided. The photovoltaic cell includes an emitter layer comprising a crystalline semiconductor material and a lightly doped crystalline substrate disposed adjacent the emitter layer. The lightly doped crystalline substrate and the emitter layer are oppositely doped. Further, the photovoltaic device includes a back surface passivated structure coupled to the photovoltaic cell. The structure includes a highly doped back surface field layer disposed adjacent the lightly doped crystalline substrate. The highly doped back surface field layer includes an amorphous or a microcrystalline semiconductor material, wherein the highly doped back surface field layer and the lightly doped crystalline substrate are similarly doped, and wherein a doping level of the highly doped back surface field layer is higher than a doping level of the lightly doped crystalline substrate. Additionally, the structure may also include an intrinsic back surface passivated layer disposed adjacent the lightly doped crystalline substrate, where the intrinsic back surface passivated layer includes an amorphous or a microcrystalline semiconductor material.

27 Claims, 4 Drawing Sheets

OTHER PUBLICATIONS

Shin-ichi Muramatsu et al.; "Control of μc-Si/c-Si interface layer structure for surface passivation of Si solar cells"; Solar Energy Materials and Solar Cells vol. 48, Issues 1-4, Nov. 1997, pp. 151-157.

M. Tanaka, S. Okamoto, S. Tsuge, S. Kiyama; "Development of Hit Solar Cells With More Than 21% Conversion Efficiency and Commercialization of Highest Performance Hit Modules"; 3rd WCPEC, Osaka, 2003; 4 Pages.

M.W.M. van Cleef et al; "Amorphous Silicon Carbide/Crystalline Silicon Heterojunction Solar Cells: A Comprehensive Study of the Photocarrier Collection"; Japanese Journal of Applied Physics, vol. 37 (1998) Part 1 No. 7, pp. 3926-3932.

M.W.M. van Cleef ; "Effects of Band Offsets On a-SiC:H/c-Si Heterojunction Solar Cell Performance"; Mat. Res. Soc. Symp. Proc. vol. 507, 1998 Materials Research Society; pp. 125-130.

\* cited by examiner

SURFACE PASSIVATED PHOTOVOLTAIC DEVICES

BACKGROUND

The invention relates generally to photovoltaic devices. More particularly, the invention relates to surface passivated photovoltaic devices having improved conversion efficiency and light confining properties.

Photovoltaic devices, such as solar cells, convert incident electromagnetic radiations into electrical energy. The performance of these devices is measured in terms of their efficiency to convert these incident radiations into electrical energy.

Photovoltaic devices are an environmentally friendly way of producing energy. As such, these devices may provide an increasingly useful option for supplying energy in the future. However, due to the high cost that is often involved in making solar cells, production of such devices may not always provide a viable option to meet all customer demands.

High efficiency solar cells offer an alternative method of cost reduction. In other words, the more power a solar cell can generate, the fewer number of cells are needed to produce the same amount of power. Thus, the overall cost of an efficient and viable photovoltaic device will be reduced. However, various factors, such as recombination of charge carriers, cause a significant loss of energy and only a small amount of incident radiation is effectively converted into electrical energy. Accordingly, cell efficiency may be diminished.

Although, solar cells having a heterojunction structure made by combining crystalline silicon (c—Si) and amorphous silicon (a—Si) have displayed improved efficiencies, there is a need to further enhance the efficiency of these devices while maintaining a low processing cost to make these devices a viable energy source. Accordingly, there exists a need for a photovoltaic device having a relatively high efficiency, which can be processed at low cost.

BRIEF DESCRIPTION

In accordance with one aspect of the present technique, a photovoltaic device comprising a photovoltaic cell and a back surface passivated structure is provided. The photovoltaic cell includes an emitter layer comprising a crystalline semiconductor material. Further, the photovoltaic cell includes a lightly doped crystalline substrate disposed adjacent the emitter layer, where the lightly doped crystalline substrate comprises a single crystal or a poly crystal semiconductor material and where the lightly doped crystalline substrate and the emitter layer are oppositely doped. The photovoltaic device also includes a back surface passivated structure comprising a highly doped back surface field layer disposed adjacent the lightly doped crystalline substrate, where the highly doped back surface field layer includes a doped amorphous or a doped microcrystalline semiconductor material, wherein the highly doped back surface field layer and the lightly doped crystalline substrate are similarly doped, and wherein a doping level of the highly doped back surface field layer is higher than a doping level of the lightly doped crystalline substrate.

In accordance with another aspect of the present technique, a photovoltaic device is provided. The photovoltaic device includes a photovoltaic cell and a back surface passivated structure. The back surface passivated structure includes an intrinsic back surface passivated layer disposed adjacent the lightly doped crystalline substrate, wherein the intrinsic layer comprises an amorphous or a microcrystalline semiconductor material. Further, the intrinsic layer is configured to provide a surface passivation, or reduce a potential barrier for an electron or a hole traversing from the lightly doped crystalline substrate to the highly doped back surface field layer, or both.

In yet another aspect of the present technique, a device is provided. The device includes a first structure having an emitter layer and a crystalline substrate, where the emitter layer and the crystalline substrate are oppositely doped and arranged to form a p-n junction, and where the emitter layer includes a crystalline semiconductor material. Further, the device includes a second structure having the crystalline substrate and a highly doped back surface field layer, where the highly doped back surface field layer may include an amorphous or a microcrystalline semiconductor material. Further, the highly doped back surface field layer and the crystalline substrate are similarly doped and wherein the highly doped back surface field layer and the crystalline substrate are arranged to form a heterojunction, and wherein a doping level of the highly doped back surface field layer is higher than a doping level of the crystalline substrate.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
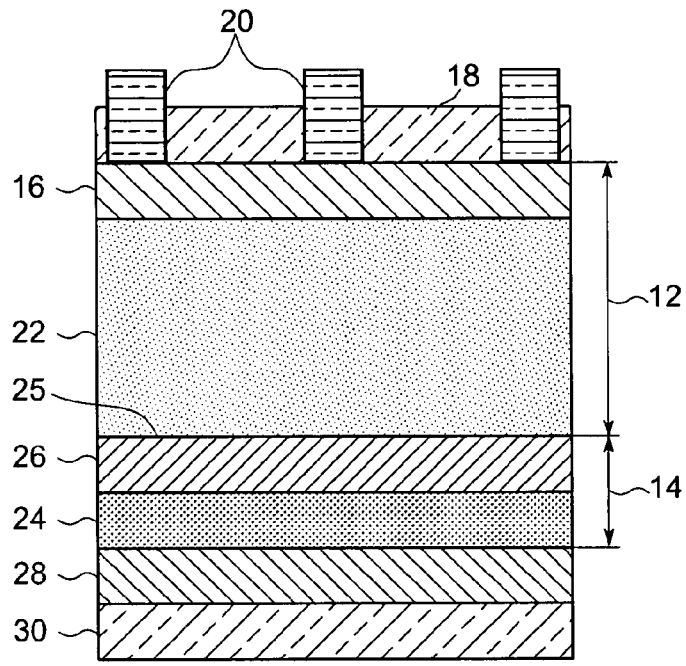
FIG. 1 is a diagrammatical representation of an exemplary photovoltaic device employing a n+-p-i-p+structure according to certain aspects of the present technique.

Typically, the structure of a photovoltaic device includes a first layer of one doped type and a second layer of the other doped type or a base layer and an emitter layer disposed between two current collection electrodes. As will be appreciated by those skilled in the art, when light is incident on the photovoltaic device, electron-hole pairs are generated which are then pulled across the junction of the layers of two doped types towards respective electrodes and contribute to the electric current produced by the device. In order to increase the efficiency of the device, it is usually desirable to prevent recombination of charge carriers, such as electrons and holes, generated within the device from the photovoltaic reaction, and to enable collection of the charge carriers at respective electrodes. In accordance with certain aspects of the present technique, the carrier generation/transport layer may include a lightly doped crystalline substrate. In certain embodiments, the lightly doped crystalline substrate may have surface defects such as unsatisfied bonds, which may prevent collection of charge carriers at the respective electrodes. In other words, the defect states in the energy band of the lightly doped crystalline substrate resulting from bulk impurities, crystalline imperfections, and surface defects such as dangling bonds may lead to trapping and recombination of the charge carriers, thereby decreasing the charge collection efficiency of the device.

Accordingly, in certain embodiments, the device structure may include a back surface passivated (BSP) structure employing one or more passivation layer of amorphous or microcrystalline semiconductor material, such as a back surface field (BSF) layer and/or an intrinsic back surface passivated (i-BSP) layer. In these embodiments, the BSF layer may be disposed adjacent to the lightly doped crystalline substrate to passivate the surface of the lightly doped crystalline substrate and also for carrier collection efficiency improvement. As used herein, the term "adjacent" implies layer positions of any two layers proximate to each other such that the layers may be either touching or facing each other. In certain embodiments, the doping level and band gap of the BSF layer is higher than that of the lightly doped crystalline substrate. As will be appreciated by those of ordinary skill in the art, passivating the surface of a crystalline substrate refers to passivation of unsatisfied bonds, or any other surface defects present on the surface of the crystalline substrate. In these embodiments, the BSF layer creates an electrical field that facilitates charge carrier collection at respective electrodes by reflecting one particular type of charge carriers towards the emitter layer to be collected by the electrodes electrically coupled to the emitter layer. In other words, passivation of the lightly doped crystalline substrate enhances minority carrier lifetime and facilitates their collection at the respective electrodes. However, in certain embodiments, the i-BSP layer may form a heterojunction along with the lightly doped crystalline substrate due to energy band bending and/or band discontinuity, which may sometimes impose limitations for the charge carrier collection. In these embodiments, the charge carriers generated in the lightly doped crystalline substrate as a result of incident light or photo-generated charge carriers may cross potential barriers while traversing from the lightly doped crystalline substrate towards the BSF layer or the emitter layer to be collected at the respective electrodes. In such embodiments, energy band bending and/or band discontinuity may be altered by varying the impurity/doping level of the lightly doped crystalline substrate and/or the i-BSP layer and/or the BSF layer. Alternatively, as described in detail below, in some embodiments, the i-BSP layer may be made thin enough to facilitate tunneling of the charge carriers through the i-BSP layer with minimal hindrance at the potential barriers present at the heterojunction. As will be appreciated by those of ordinary skill in the art, tunneling is a quantum-mechanical effect, which is a result of the wave-like properties of the particles by which a particle is allowed to penetrate through a seemingly impenetrable barrier into a region of space that would be forbidden by classical mechanics.

Typically, there are a variety of parameters that may be used to characterize the performance of a photovoltaic device. Some of these parameters may include conversion efficiency, open-circuit voltage (Voc), short circuit current (Jsc), and fill factor. As will be appreciated by those of ordinary skill in the art, Voc is defined as a maximum possible voltage across a photovoltaic device, such as a solar cell, when no current is flowing. Further, Jsc is defined as the maximum current a photovoltaic device can provide when the device is operated at a short circuit condition. In some embodiments, the thickness of the emitter layer may be reduced to minimize carrier loss and/or optical loss at the emitter layer and thereby, increase the current density. In a photovoltaic device, which has a constant Jsc and Voc, the fill factor may be improved under a set illumination intensity when the shunt resistance is kept relatively high while the series resistance is maintained low. As will be appreciated, the various layers and the interfaces formed between these layers that contribute to the formation of the devices and the associated resistance components may be optimized to enhance the fill factor and therefore, the power conversion efficiency of the device. In these embodiments, an intrinsic back surface passivated (i-BSP) layer of desirable thickness that provides a low surface recombination velocity at the BSF layer may be employed to increase the current density in the photovoltaic device. Further, when complemented with a highly doped BSF layer, collection of charge carriers of particular type may be enhanced through hindered electric field thereby improving the performance of the photovoltaic device. In certain embodiments, the i-BSP layer disposed on the back surface of the photovoltaic device may be made discontinuous. In these embodiments, a discontinuous i-BSP layer enables direct contact of the lightly doped crystalline substrate to the highly doped BSP layer in the discontinuous regions/holes in the i-BSP layer. In some embodiments, the ratio of the sum of the surface areas of the discontinuous regions of the i-BSP layer to the entire surface area of the i-BSP layer may range from about 0.5% to about 20%. Generally, this ratio of the surface area of the discontinuous region to the entire surface area of the i-BSP layer depends on factors such as the passivation efficiency of the i-BSP layer, the properties of the thin hydrogen-rich dihydride interface layer (up to 27% hydrogen content, for example) at the interface of the intrinsic amorphous silicon and the crystalline substrate, the doping level, and the BSF effectiveness. In these embodiments, the i-BSP layer may be patterned on the highly doped BSF layer via lithography or by particular film deposition processes.

FIG. 1 illustrates an exemplary photovoltaic device 10 employing a photovoltaic cell 12 electrically coupled to a back surface passivated (BSP) structure 14. In certain embodiments, the photovoltaic device 10 may include a solar cell. In the illustrated embodiment, the photovoltaic cell 12 includes an emitter layer 16 having a crystalline semiconductor material. In certain embodiments, the emitter layer 16 may include a semiconductor material such as silicon. Typically, charge collection efficiency of the emitter layer 16 may be enhanced by optimizing the thickness and doping level of the emitter layer 16. As will be appreciated by those skilled in the art, upon absorption, the extra energy from the photons having energy values higher than that of the band gap of the semiconductor material is transferred into undesired heat. In certain embodiments, the thickness of the emitter layer 16 may be reduced, thereby reducing light absorption loss due to the emitter layer 16. In certain embodiments, the thickness of the emitter layer 16 may be in a range from about 200 nm to about 1000 nm. In some embodiments, the doping level of the emitter layer 16 may be in a range from about $1\times10^{17}$ cm$^{-3}$ to about $1\times10^{21}$ cm$^{-3}$, and preferably in a range from about $1\times10^{19}$ cm$^{-3}$ to about $3\times10^{20}$ cm$^{-3}$.

In certain embodiments, the photovoltaic device 10 may optionally include a dielectric layer 18 disposed adjacent the emitter layer 16. Typically, the dielectric layer 18 is used to passivate the surface of the emitter layer 16. Additionally, the dielectric layer 18 may also be used as an anti-reflection coating (ARC). In certain embodiments, the dielectric layer may include silicon nitride, silicon oxide, silicon oxynitride, titanium oxide, zinc oxide, magnesium fluoride, silicon oxynitride zirconium oxide, alumina, or combinations thereof. Further, the dielectric layer 18 may also include at least one metal oxide or a metalloid oxide which enhances the tetrahedral structure of alumina, for example, an $(Al_2O_3)_x(TiO_2)_{1-x}$ alloy, comprising a mixture of two oxides alumina and titanium oxide. Additionally, one or more electrodes, such as metal contact electrodes 20 may be disposed on the dielectric layer 18. In certain embodiments, the metal contact electrodes 20 are used to collect the charge carriers. As will be appreciated, depending on the doping type, doping level, or activation energy of the emitter layer 16, the metal contact electrodes 20 having specific dimensions may be made of materials which have suitable work function and resistivity values to allow their contact resistance with the emitter layer to be in a range from about 0.05 Ohms to about 10 Ohms, for enhanced carrier collection.

In the presently contemplated embodiment, the photovoltaic cell 12 further comprises a relatively thick layer, such as a lightly doped crystalline substrate 22 disposed adjacent to the relatively heavily doped emitter layer 16. As described in detail below, in certain embodiments, the lightly doped crystalline substrate 22 may include a single crystal or a poly crystalline or semiconductor material. In certain embodiments, the lightly doped crystalline substrate 22 may have doping levels ranging from about $1\times10^{14}$ cm$^{-3}$ to about $5\times10^{16}$ cm$^{-3}$. In certain embodiments, the lightly doped crystalline substrate 22 and the emitter layer 16 may be oppositely doped. In other words, the lightly doped crystalline substrate 22 and the emitter layer 16 may form a p-n junction. For example, in one embodiment, the emitter layer 16 may be n or n+ doped and the lightly doped crystalline substrate 22 may be p-doped. Alternatively, in some embodiments the emitter layer 16 may be p or p+ doped and the lightly doped crystalline substrate 22 may be n-doped. As used herein, the symbols n+ and p+ represent doping levels that have relatively higher values than the doping levels represented by symbols n and p.

Further, in the illustrated embodiment, the BSP structure 14 may include a highly doped back surface field (BSF) layer 24. In the illustrated embodiment, the highly doped BSF layer 24 is disposed above the lightly doped crystalline substrate 22. In certain embodiments, the highly doped BSF layer 24 may include doped amorphous or microcrystalline semiconductor material. In these embodiments, the highly doped BSF layer 24 may include silicon, silicon carbide, silicon germanium, or combinations thereof. In certain embodiments, the highly doped BSF layer 24 and the lightly doped crystalline substrate 22 may have the same doping type (n or p type) with a doping level of the highly doped BSF layer 24 being higher than the doping level of the lightly doped crystalline substrate 22. Typically, the material and doping levels of the various layers of the photovoltaic device 10 are chosen so as to provide an accommodating energy level diagram of the photovoltaic device 10. In other words, the material and the doping level of the various layers of the photovoltaic device 10 controls the energy level diagram and therefore the characteristic properties such as charge transport, current density, and efficiency of the photovoltaic device. For example, varying the doping levels and the doping types (n or p type) of the three layers, emitter layer 16, lightly doped crystalline substrate 22 and the highly doped BSF layer 24 changes the energy level diagrams of the photovoltaic device as shown in alternate embodiments in FIGS. 2, 4, 7 and 9 and as described further below. In certain embodiments, the highly doped BSF layer 24 is doped to achieve a doping level ranging from about $1\times10^{17}$ cm$^{-3}$ to about $8\times10^{20}$ cm$^{-3}$ or an activation energy ranging from about 0.08 eV to about 1.0 eV. In some embodiments, the highly doped BSF layer 24 may be doped to achieve a doping level ranging from about $6\times10^{17}$ cm$^{-3}$ to about $1\times10^{20}$ cm$^{-3}$ or alternatively, an activation energy ranging from about 0.2 eV to about 0.9 eV. In an exemplary embodiment, the highly doped BSF layer 24 may be doped to achieve a doping level ranging from about $1\times10^{17}$ cm$^{-3}$ to about $1\times10^{19}$ cm$^{-3}$ alternatively, the layer 24 may be doped to achieve an activation energy ranging from about 0.08 eV to about 0.5 eV. Further, in certain embodiments, the energy band gap of the highly doped BSF layer 24 may vary in a range from about 1.2 eV to about 2.1 eV.

Additionally, in certain embodiments, the BSP structure 14 may include an intrinsic back surface passivated (i-BSP) layer 26 disposed between the highly doped BSF layer 24 and the lightly doped crystalline substrate 22 forming a heterojunction 25 between the i-BSP layer 26 and the lightly doped crystalline substrate 22. In certain embodiments, the i-BSP layer 26 includes an amorphous or microcrystalline semiconductor material. In some embodiments, the i-BSP layer 26 may include silicon, silicon carbide, silicon germanium, or combinations thereof. In certain embodiments, the thickness of the i-BSP layer 26 may range from about 1 nm to about 30 nm, and preferably from about 1 nm to about 5 nm. Typically, employing an i-BSP layer 26 at a surface of the lightly doped crystalline substrate 22 facilitates an effective surface passivation, which in turn facilitates carrier collection at the electrodes and reduces charge recombination. In certain embodiments, electrons from the electron-hole pairs in the lightly doped crystalline substrate 22 produced from the photovoltaic effect close to the emitter layer 16 may diffuse and drift across the semiconductor p-n junction to the emitter layer 16 in absence of the BSF, thereby producing part of the charges necessary for the photovoltaic device operation. In these embodiments, electrons generated farther away from the emitter layer 16 in the direction towards the BSF layer 24 are made to traverse towards the emitter layer 16 because of the presence of BSF which reflects these electrons from the i-BSP layer 26 and the BSF layer 24 towards the emitter layer 16, for charge collection at the respective electrode. In the illustrated embodiment, a surface of the lightly doped crystalline substrate 22 is passivated using the i-BSP layer 26, while the surface of the emitter layer 16 is passivated using the dielectric layer 18, which also serves as an ARC. Additionally, as described in detail below, in certain embodiments, the i-BSP layer 26 may facilitate tunneling of the holes from the lightly doped crystalline substrate 22 to the highly doped BSF layer 24. In these embodiments, the thickness of the BSF layer may range from about 2 nm to about 30 nm.

Furthermore, in the illustrated embodiment, the photovoltaic device 10 may also include a transparent conductive back electrode layer, such as a transparent conductive oxide (TCO) layer 28 disposed adjacent the highly doped BSF layer 24. Typically, the TCO layer 28 is configured to collect charge carriers generated from the electrically coupled photovoltaic cell 12 and BSP structure 14. In certain embodiments, the TCO layer 28 may include indium tin oxide or doped zinc oxide. Furthermore, in the presently contemplated embodiment, a reflector metal back contact, such as a reflective back contact layer 30 may be disposed adjacent the highly doped BSF layer 24 or TCO 28 layer. As will be appreciated by those skilled in the art, the reflective back contact layer 30 is typically employed to enhance light reflection or trapping. Additionally, the reflective back contact layer 30 may also facilitate the conductivity of the back electrode employed in the photovoltaic device 10.

As will be appreciated by those skilled in the art, depending on the nature and type of the lightly doped crystalline substrate the process conditions of the photovoltaic device are realized. For example, in certain embodiments the lightly doped crystalline substrate may include a semiconductor material such as silicon in the form of a single or poly crystal. In such exemplary embodiments, the processing temperature for the photovoltaic device 10 may be advantageously kept low so as to minimize thermal budget and increase fabrication throughput. In certain embodiments of the present technique, the various layers of the photovoltaic device 10 may be formed by any suitable deposition techniques, such as solution casting using, for example, dip coating, spin coating, bar coating, or doctor blade coating. Alternatively, vacuum deposition techniques may also be employed to deposit various layers of the photovoltaic device 10, examples of vacuum deposition techniques may include sputtering, thermal evaporation, e-beam evaporation, chemical vapor deposition (CVD), plasma enhanced chemical vapor deposition (PECVD), radio frequency plasma enhanced chemical vapor deposition (RFPECVD), expanding thermal-plasma chemical-vapor deposition (ET-PCVD), reactive sputtering, reactive ion milling, electron-cyclotron-resonance plasma-enhanced chemical-vapor deposition (ECRPECVD), inductively coupled plasma-enhanced chemical-vapor deposition (ICPECVD), atomic layer deposition (ALD), Penning discharge, helicon plasma source, plasma beam source plasma enhanced chemical vapor deposition (PBSPECVD), or combinations thereof. Furthermore, other types of deposition techniques suitable for use in manufacturing integrated circuits or semiconductor-based devices may also be used in the deposition of some or all of the layers described herein. Further, the transparent conductive oxide and the two electrodes may be formed by using techniques such as sputtering, thermal evaporation, e-beam evaporation, reactive ion milling, electroplating, electroless plating, or screen printing.

Figure 2:
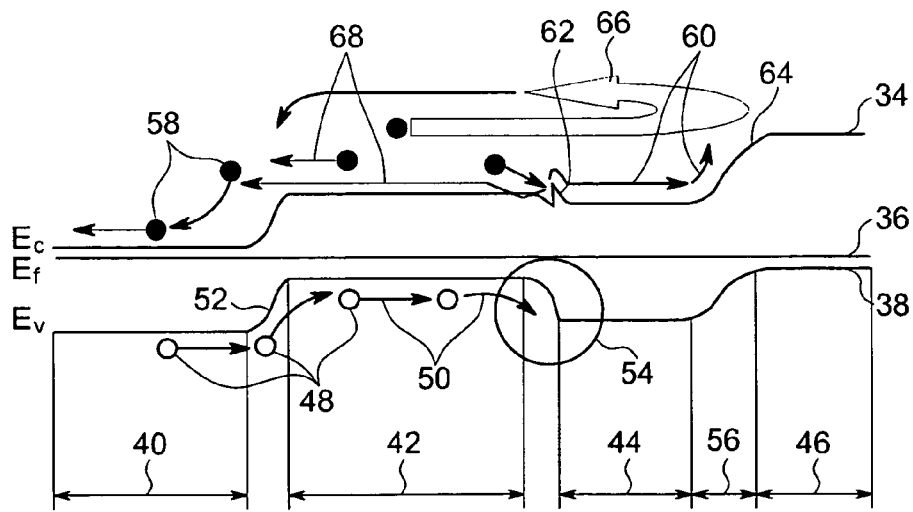
FIG. 2 is a diagrammatical representation of an energy band diagram of the photovoltaic device of FIG. 1 according to certain aspects of the present technique.

In an exemplary embodiment of FIG. 1, the emitter layer 16 is n+-doped, the lightly doped crystalline substrate 22 is p-doped, the highly doped BSF layer 24 is p+-doped, and as the name suggests, the i-BSP layer 26 is intrinsic. In other words, the photovoltaic device 10 includes a semiconductor structure having n+-p-i-p+ semiconductor junctions. The energy band diagram 32 of the n+-p-i-p+ semiconductor junctions is illustrated in FIG. 2. In the illustrated embodiment, the reference numerals 34, 36 and 38 refer to the energy levels of conductive band (CB), Fermi energy level, and valence band (VB) respectively.

In the presently contemplated embodiment, the region denoted by the reference numeral 40 in the energy band diagram 32 represents the energy levels in emitter layer 16 (see FIG. 1) as employed in the photovoltaic device 10 (see FIG. 1). Similarly, the region indicated by the reference numeral 42 represents the energy levels in the lightly doped crystalline substrate 22 (see FIG. 1), the region indicated by the reference numeral 44 represents energy levels of the i-BSP layer 26, and the region indicated by the reference numeral 46 represents the energy levels in the highly doped BSF layer 24 (see FIG. 1).

In the presently contemplated embodiment, holes 48 of the electron-hole pairs generated as a result of light incident on the photovoltaic device 10 travels in the valence band 38 in the direction shown by arrows 50. In the presently contemplated embodiment, some of the holes 48 that are generated in the emitter layer 16 come across an energy band bending 52 while traversing from region 40 to 42. This energy band bending 52 creates a built-in electric field that enables and facilitates holes movement to the hole collector electrode or the TCO layer 28. In case of a relatively thin emitter layer 16 which is relatively heavily doped and made of a single crystal silicon, the amount of holes available for final charge collection from the emitter layer 16 is less significant unless the emitter layer 16 is designed to enhance absorption of the blue and ultraviolet (UV) light for space cell application. However, some holes generated in and crossing the lightly doped crystalline substrate 22 shown by reference numeral 42, the holes 48 come across a potential barrier 54 between regions 42 and 44. In this embodiment, the potential barrier 54 is a heterojunction that is formed due to band discontinuity in the VB by placing a lower band gap crystalline substrate having one doping type in contact with the wider band gap amorphous layer that has the opposite doping type and a relatively low activation energy. In the illustrated embodiment, the potential barrier 54 along with a likely Schottky or insulator barrier created due to the junction formation of highly doped BSF layer 24 and TCO layer 28 creates a combined hindered electric field near or across the heterojunction 25 that reflects the holes 48 and sends them back to the active region of the photovoltaic cell 12, thereby causing a loss in hole collection efficiency. In these embodiments, a certain fraction of the holes 48 may recombine in the photovoltaic cell 12 before reaching and being collected at the back TCO layer 28, thereby, decreasing the hole collection efficiency of the photovoltaic device. In certain embodiments, this undesirable recombination of the holes 48 may be reduced by an appropriate combination of the dopant concentration in the emitter layer 16, lightly doped crystalline substrate 22, highly doped BSF layer 24, and the work function of the carrier collection electrodes at the back surface, in other words, TCO layer 28 and/or reflective back contact layer 30. In addition, the i-BSP layer 26 may be made ultra thin, having a thickness in a nanometer range to facilitate tunneling of the holes 48 from the lightly doped crystalline substrate 22 to the highly doped BSF layer 24 with minimal hindrance caused by the potential barrier 54. Further, the VB 38 also includes an energy bend bending 56 between regions 44 and 46.

In the presently contemplated embodiment of FIG. 2, the electrons 58 generated in the photovoltaic cell 12 as a result of incident light, which are mostly from the lightly doped crystalline substrate 22, have to traverse in the CB 34 towards the emitter layer 16 for charge collection. In the illustrated embodiments, the electrons 58 may be produced in the lightly doped crystalline substrate 22 either in a region relatively close to or relatively farther away from the front surface (surface of the lightly doped crystalline substrate 22 close to the dielectric layer 18) of the lightly doped crystalline substrate 22. In certain embodiments, where electrons 58 are produced in a region positioned within the diffusion length of the electrons but away from the front surface of the lightly doped crystalline substrate 22, effective collection of the electrons 58 at the front surface is made possible. For example, in the illustrated embodiment of FIG. 2, the electrons produced in the region proximate the front surface of the lightly doped crystalline substrate 22 transport in the direction as shown by arrows 68, where electrons move in the direction towards the emitter layer 16 for charge collection. Further, in the illustrated embodiment, electrons produced relatively away from the front surface of lightly doped crystalline substrate 22 may have the possibility of traversing in the direction illustrated by arrows 60 or in other words, towards the back surface where they come across a shallow CB potential well at the band discontinuity 62 region. In certain embodiments, the band discontinuity 62 may be overcome by a small amount of energy gained from thermal or optical radiations. In certain embodiments, the back surface field at the region 46 may be designed to reflect the electrons back by the potential barrier 64 in the direction shown by arrow 66. In these embodiments, the i-BSP layer 26 may be designed to provide low back surface recombination velocity and therefore, higher electron carrier lifetime and diffusion length allows these reflected electrons from the back surface to be collected at the front surface of the lightly doped crystalline silicon substrate 22.

Figure 3:
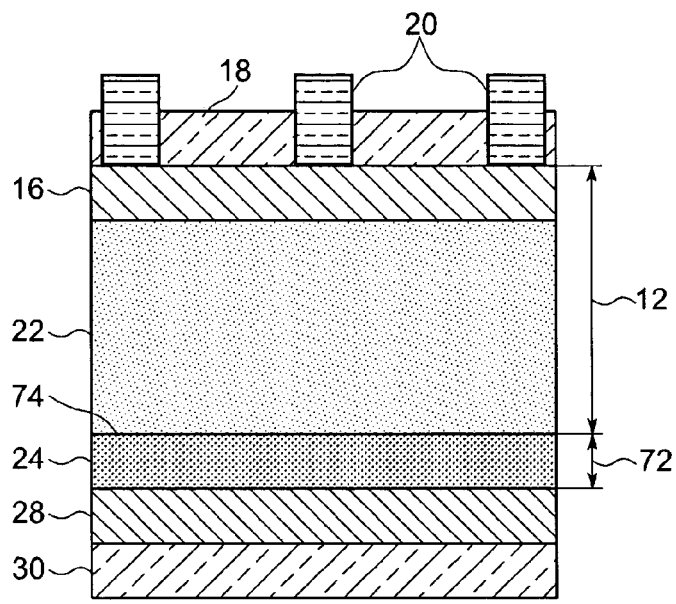
FIG. 3 is a diagrammatical representation of an exemplary photovoltaic device without the intrinsic back surface passivated layer and having a n+-p-p+structure according to certain aspects of the present technique.

FIG. 3 illustrates an alternate embodiment of the photovoltaic device of FIG. 1. In the illustrated embodiment, the exemplary photovoltaic device 70 includes a back surface passivated (BSP) structure 72 having a heterojunction 74. In the illustrated embodiment, the heterojunction 74 is formed between the lightly doped crystalline substrate 22 and the highly doped BSF layer 24 as opposed to the heterojunction 25 of FIG. 1, which is formed between the lightly doped crystalline substrate 22 and the i-BSP layer 26. As with FIG. 1, in the illustrated embodiment, the emitter layer 16 is n+-doped, the lightly doped crystalline substrate 22 is p-doped, and the highly doped BSF layer 24 is p+-doped, thus forming a n+-p-p+ structure.

Figure 4:
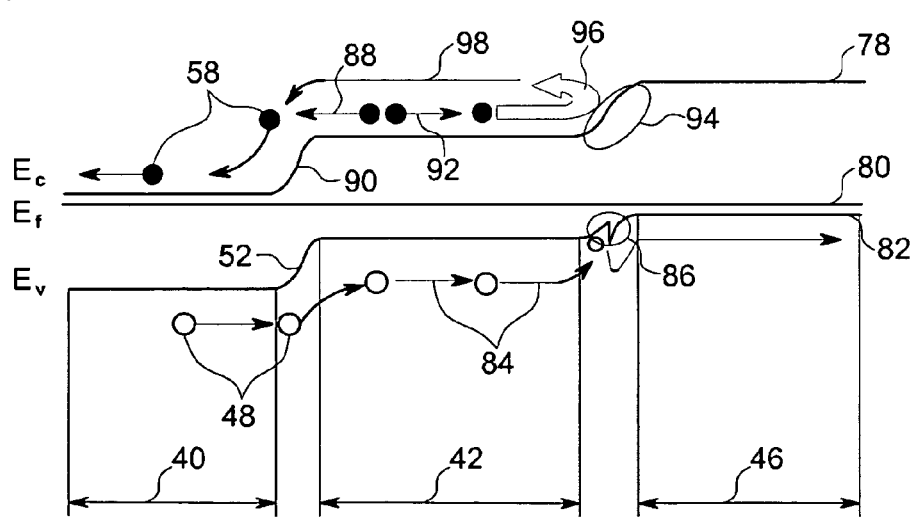
FIG. 4 is a diagrammatical representation of an energy band diagram of the photovoltaic device of FIG. 3 according to certain aspects of the present technique.

FIG. 4 illustrates an energy band diagram 76 of the photovoltaic device 70 of FIG. 3. In the illustrated embodiment, the energy levels of the CB, Fermi level and VB are shown by reference numerals 78, 80 and 82 respectively. In the illustrated embodiment, the region 40 represents an energy level diagram of the emitter layer 16 as described above with reference to FIG. 2. Similarly, regions 42 and 46 represent energy level diagrams of the doped crystalline substrate 22 and the highly doped BSF layer 24. In the illustrated embodiment, an energy band bending 52 is formed in the VB 82 at the junction of the emitter layer 16 and the lightly doped crystalline substrate 22. In certain embodiments, the holes 48 traversing at the VB from the emitter layer 16 towards the lightly doped crystalline substrate 22 come across the energy band bending 52 as described above with reference to FIG. 2. In the illustrated embodiment, the absence of the i-BSP layer 26 results in a band discontinuity 86 and a shallow potential well at the VB as opposed to a potential barrier 54 (see FIG. 2) formed at a side of the lightly doped crystalline substrate 22 near the BSF layer 24. As will be appreciated by those skilled in the art, a shallow potential well may be overcome by electrons that possess energy higher than the potential energy of the well, and therefore does not adversely affect the current density. As will be appreciated, the electrons may gain this desirable energy to overcome the shallow potential, from photons or heat irradiations on the materials. In the illustrated embodiment, lack of i-BSP layer 26 (see FIG. 2) at the surface of the doped crystalline substrate 22 results in an ineffective surface passivation of the lightly doped crystalline substrate 22, thereby resulting in increased recombination of charge carriers. In the presently contemplated embodiment, the back surface of the lightly doped crystalline substrate 22 makes contact with the BSF layer 24 which is highly doped and exhibits higher impurity and dangling bond density, and higher degree of surface roughening as compared to the embodiment illustrated in FIG. 2 employing the intrinsic i-BSP layer 26 thereby, adversely effecting the interface property while providing a relatively higher conductivity for charge carrier collection. Hence, there exists a tradeoff between passivating the surface of the lightly doped crystalline substrate 22 and reducing or eliminating the potential barrier for the charge carriers at the back surface. As discussed above, in these embodiments, the potential barrier 54 (see FIG. 2) at the VB due to band discontinuity may be substantially removed by the removal of i-BSP layer 26 (see FIG. 2). Alternatively, when employing the i-BSP layer 26 (see FIG. 2) in the device, the height of the potential barrier at the VB may be reduced by adjusting the Fermi level and band gap energy of the i-BSP layer 26. In these later embodiments, the potential barrier that may also exist due to Schottky contact formation at the BSF layer 24 and the TCO layer 28 at the back surface of the lightly doped crystalline substrate 22 may be substantially reduced by modification of the dopant concentration in respective semiconductor layers. Alternatively, the potential barrier due to Schottky contact may be eliminated by replacing TCO layer 28 with an electrode layer that provides Ohmic contact to the BSF layer semiconductor.

In the illustrated embodiment, the holes 48 traverse across the p-n junction from region 40 towards region 42 without being much hindered by the bandgap discontinuity at the VB 82. In this embodiment, the holes 48 continue their diffusion movement in the region 42 in the direction shown by arrows 84 where they encounter a shallow potential well at the back heterojunction 74 with band discontinuity 86 and subsequently reach the BSF layer 24 (see FIG. 3) or region 46 for collection. In the CB 78 of the illustrated embodiment, the electrons 58 traversing from the lightly doped crystalline substrate 22 towards the emitter layer 16 as shown by arrows 88 drift over the junction region with an energy band bending 90 and a built-in electric field between the emitter layer 16 and the lightly doped crystalline substrate 22 to reach the emitter layer 16 and get collected at the metal contact electrodes 20. Conversely, the electrons that diffuse in a reverse direction shown by arrow 92 relative to the traversing direction 88 of the electrons 58, that is to say, the electrons traversing from the lightly doped crystalline substrate 22 towards the highly doped BSF layer 24, come across a potential barrier 94 induced by energy band banding and band discontinuity due to the formation of heterojunction 74. In certain embodiments, these electrons traversing in the direction shown by arrow 92 may get reflected by the potential barrier 94 as shown by arrow 96 and start traversing in the direction opposite to their initial direction as shown by arrow 98. As will be appreciated, with sufficiently low back surface recombination velocity and high diffusion length of these reverse-traversed electrons (shown by arrow 92), certain portion of them can finally reach the emitter layer 16 and get collected at the respective electrode. Unlike the structure of photovoltaic device 10 (see FIG. 1) that exhibits a shallow potential well at the heterojunction 25 (see FIG. 1) at band discontinuity region 62 (see 2), the elimination of the i-BSP layer 26 in the illustrated embodiments of FIGS. 3 and 4 creates a heterojunction 74 which has only a potential barrier 94 at the CB 78 without a potential well.

Figure 5:
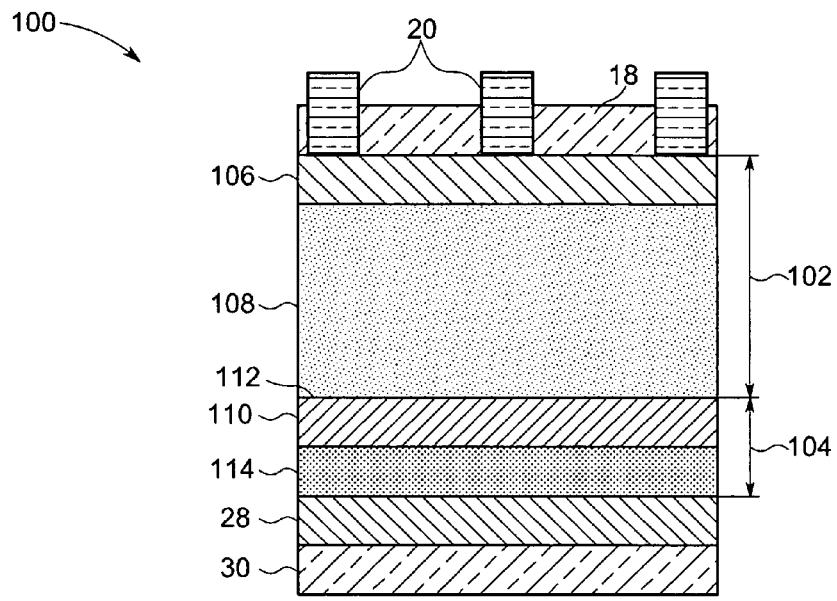
FIG. 5 is a diagrammatical representation of an exemplary photovoltaic device employing a p+-n-i-n+structure having a variable thickness of the i-layer according to certain aspects of the present technique.

Referring now to FIG. 5, an alternate embodiment of the exemplary photovoltaic device of FIG. 1, in accordance with certain embodiments of the present technique is illustrated. In the presently contemplated embodiment, the photovoltaic device 100 includes a dielectric layer 18, metal electrode 20, TCO layer 28 and reflective back contact 30 as described above with reference to FIG. 1. Further, in the illustrated embodiment, the photovoltaic device 100 includes a photovoltaic cell 102 and a back surface passivated structure (BSP) 104. In the illustrated embodiment, the photovoltaic cell 102 includes a p+-doped emitter layer 106 disposed adjacent a lightly n-doped crystalline substrate 108. In certain embodiments, the n-doped crystalline substrate 108 may be a single crystal or a poly crystalline substrate.

Further, in the illustrated embodiment of FIG. 5, the photovoltaic device 100 includes back surface passivated structure 104. In the presently contemplated embodiment, the back surface passivated structure 104 includes an i-BSP layer 110 and a highly n+-doped BSF layer 114. In the illustrated embodiment the i-BSP layer 110 is disposed adjacent the lightly doped crystalline substrate 108, such that the i-BSP layer 110 and the lightly doped crystalline substrate 108 form a heterojunction 112. As will be appreciated, the exemplary embodiment illustrated in FIG. 5 employs a p+-n-i-n+ structure. As described above with reference to the arrangement of FIG. 2, a small value of the thickness of the i-BSP layer 110 adjacent the lightly doped crystalline substrate 108 facilitates tunneling of the electrons from the lightly doped crystalline substrate 108 into the highly n+-doped BSF layer 114 despite the presence of the potential barrier 154 of the heterojunction 112.

Figure 6:
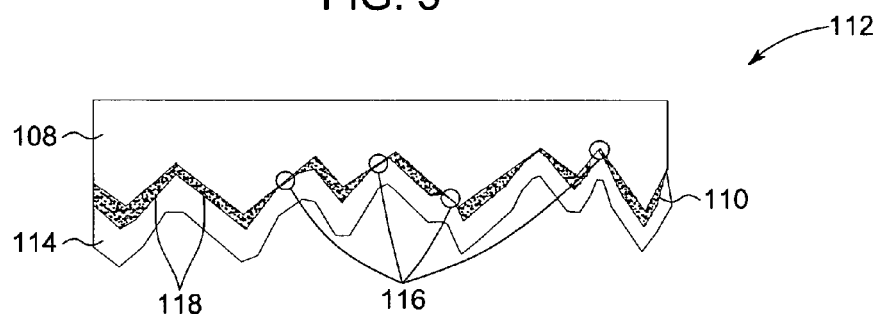
FIG. 6 is an exploded view of the point or line contact areas present in the photovoltaic device of FIG. 5 according to certain aspects of the present technique.
Figure 7:
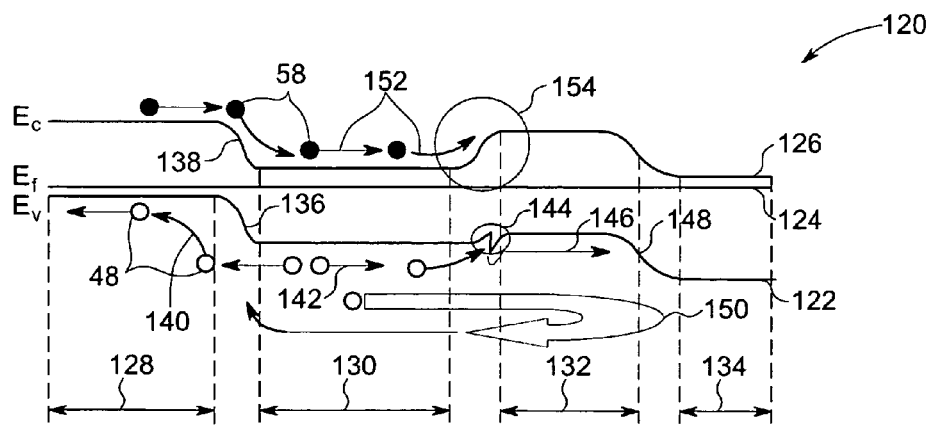
FIG. 7 is a diagrammatical representation of an energy band diagram of the photovoltaic device of FIG. 5 according to certain aspects of the present technique.

In the presently contemplated embodiment, the i-BSP layer 110 may have a variable thickness as shown in FIG. 6. FIG. 6 is an exploded view of the heterojunction 112 of FIG. 5. In certain embodiments, the thickness of the i-BSP layer 110 may vary in a range from about 1 nm to about 30 nm. In some embodiments, the thickness of the i-BSP layer 110 may vary from about 1 nm to about 5 nm to facilitate carrier tunneling. In some embodiments, an i-BSP layer 110 having ultra thin thickness of the range of root mean square (RMS) surface roughness or higher of the lightly doped crystalline substrate 108 may be employed. In other embodiments, the constraint on the thickness of the i-BSP layer 110 may be relaxed by creating discontinuity in the i-BSP layer 110 using patterning techniques such as, lithography or by film deposition or by using a lower band gap material such as microcrystalline silicon. In certain embodiments of FIG. 6, the variable thickness of the i-BSP layer 110 is such that at some locations, such as encircled regions represented by reference numeral 116, the lightly doped crystalline substrate 108 may be in point and/or line contact with the highly n+-doped BSF layer 114. Advantageously, the point and/or line contact areas 116 do not suffer from any heterojunction induced potential barriers, due to a heterojunction formed directly between the highly n+-doped BSF layer 114 and the lightly doped crystalline substrate 108. Also, in these embodiments, the photovoltaic device 100 suffers relatively less Staebler-Wronski effect due to the smaller thickness of the i-BSP layer 110 and highly n+-doped BSF layer 114. However, the point and/or line contact areas 116 may suffer from low current characteristics and high recombination rates as described above with reference to FIG. 6. As discussed above with reference to FIG. 4, the potential barrier that may also exist due to Schottky contact formation at the BSF layer 114 and the TCO layer 28 at the back surface of the lightly doped crystalline substrate 108 may be substantially reduced by modification of the dopant concentration in respective semiconductor layers. As discussed above, having the i-BSP layer 110 provides surface passivation for the lightly doped crystalline substrate 108 at the heterojunction 112. Additionally, as discussed previously the formation of possible Schottky barriers at the front and back interface regions of the emitter layer, the BSF layer, and the respective contact electrodes may induce an adverse mechanism from electric field that may degrade the carrier collection efficiency. As will be appreciated, such problem may be substantially reduced by band profile engineering by selecting proper doping levels of the semiconductor layers and contact electrode work functions and/or a combined process of thermal annealing and metal induced re-crystallization.

Further, the regions 110 denoted by reference numeral 118 represent regions having i-BSP layer 110 disposed between the lightly doped crystalline substrate 102 and the highly n+-doped BSF layer 114. Advantageously, these regions 118 provide surface passivation for the lightly doped crystalline substrate 102. Depending on the thickness of the i-BSP layer 110 in the regions 118, the regions 118 may either facilitate tunneling of electrons or may form a heterojunction induced potential barrier as discussed above. In the illustrated embodiment of FIG. 7, the energy band diagram 120 includes the energy levels of a valence band 122, a Fermi level 124 and a conduction band 126. In the illustrated embodiment, the region 128 represents the energy level diagram of the p+-doped emitter layer 106. Further, the region 130 represents the energy level diagram of the lightly n-doped crystalline substrate 108, the region 132 represents the energy level diagram of the i-BSP layer 110 and the region 134 represents the energy level diagram of the highly n+-doped BSF layer 114.

In the illustrated embodiment, energy band diagram 120 exhibits energy band bending and/or band discontinuities between the regions 128 and 130, which represent the energy levels of p+-doped emitter layer 106 and lightly n-doped crystalline substrate 108 respectively. In the illustrated embodiment, the energy band bending 136 in the valence band 122 facilitate movement of the holes 48 from the lightly n-doped crystalline substrate 108 towards the p+-doped emitter layer 106 as shown by arrows 140. In certain embodiments, some of the holes of the electron-hole pairs generated in the lightly n-doped crystalline substrate 108 may move towards the i-BSP layer 110 as shown by arrow 142. In such embodiments, the holes may come across a shallow potential well at the band discontinuity 144. In certain embodiments, the holes overcoming the potential well at 144 and moving towards the highly n+-doped BSF layer 114 as shown by arrow 146 may come across a potential barrier 148. In the presently contemplated embodiment, the holes 48 are reflected at the potential barrier 148 and are returned towards the lightly doped crystalline substrate 108 to be collected by the metal electrode disposed at the p+-doped emitter layer 106 as shown by arrow 150.

Further, the energy band diagram 120 includes electrons 58 traversing in the CB as shown by arrows 152. In the illustrated embodiment, the energy band bending and discontinuity induced at the conduction bands of the lightly n-doped crystalline substrate 108 (region 130) and the i-BSP layer 110 (region 132) forms a potential barrier 154. In certain embodiments, the potential barrier 154 hinders the motion of the electrons 58. However, in some embodiments, the thickness of the i-BSP layer 110 may be selected such that the electrons 58 may tunnel through the i-BSP layer 110 and do not have to cross the potential barrier 154. As described earlier, in these embodiments, the thickness of the i-BSP layer 110 may vary in a range from about 1 nm to about 5 nm to facilitate tunneling of electrons through the i-BSP layer 110 layer.

Figure 8:
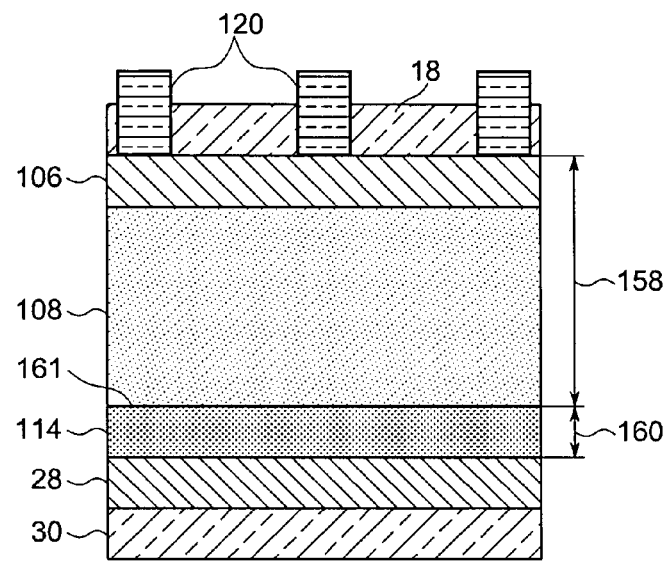
FIG. 8 is a diagrammatical representation of an exemplary photovoltaic device without the intrinsic back surface passivated layer and having a p+-n-n+ structure according to certain aspects of the present technique.

Referring now to FIG. 8, an alternate exemplary embodiment of the photovoltaic device, in accordance with certain aspects of the present technique is illustrated. In the illustrated embodiment, the exemplary photovoltaic device 156 employs a photovoltaic cell 158 and a BSP structure 160. In this embodiment, the photovoltaic cell 158 includes the p+-doped emitter layer 106 and lightly n-doped crystalline substrate 108 as described above with reference to FIG. 7. Further, the photovoltaic cell 158 includes a heterojunction 161 formed between the highly n+-doped BSF layer 114 of the BSP structure 160 and the lightly n-doped crystalline substrate 108. Accordingly, the exemplary photovoltaic device 156 includes a p+-n-n+structure. In the presently contemplated embodiment, the electron collection barrier or the potential barrier 154 (see FIG. 7) may be removed or reduced as described in detail below with reference to FIG. 9.

Figure 9:
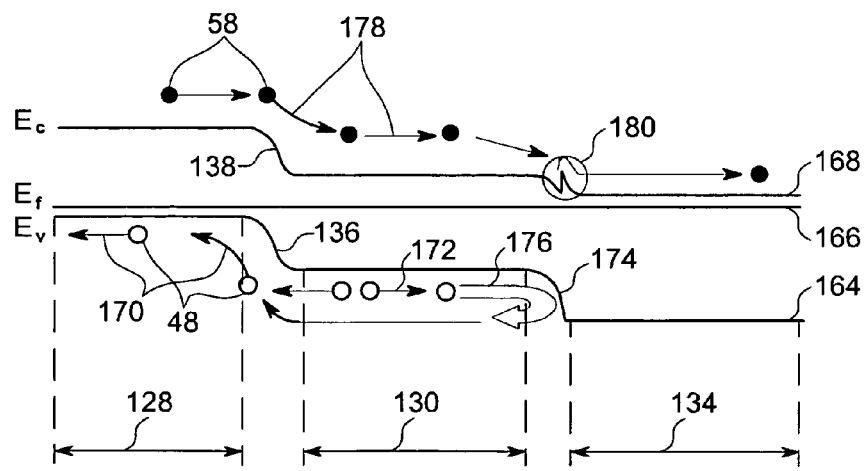
FIG. 9 is a diagrammatical representation of an energy band diagram of the photovoltaic device of FIG. 8 according to certain aspects of the present technique.

FIG. 9 illustrates an energy band diagram 162 of the photovoltaic device 156 having the energy levels of a valence band 164, Fermi level 166 and a conduction band 168. In the illustrated embodiment, as described above with reference to FIG. 7, the region 128 represents the energy level diagram of the p+-doped emitter layer 106, the region 130 represents the energy level diagram of the lightly n-doped crystalline substrate 108, and the region 134 represents the energy level diagram of the highly n+-doped B SF layer 114. Further, the junction between the regions 128 and 130 form energy band bending 136 and energy band bending 138 at the VB 164 and CB 168 respectively. In the presently contemplated embodiment, the holes 48 traversing in the VB 164 as shown by arrows 170 are collected by the metal electrode 120 disposed adjacent the p+-doped emitter layer. In the illustrated embodiment, the VB 164 includes an energy band bending and bandgap discontinuity at the heterojunction 161 (see FIG. 8) in the form of potential barrier 174 for holes. In certain embodiments, the holes 48 traversing towards the region 134, that is to say, the holes traversing towards the highly n+-doped BSF layer 114 from the lightly n-doped crystalline substrate 108 as shown by arrows 172 may come across a potential barrier 174 and get reflected by the potential barrier 174 as shown by arrow 176. In some embodiments, the reflected holes 48 may then start moving towards the region 128 to be collected at the metal contact electrode 120. Further, in the illustrated embodiment the electrons 58 moving in the direction illustrated by arrows 178 may come across a small potential well at band discontinuity region 180, which may be overcome by a small amount of energy as discussed above.

Although the present techniques refer to the back surface passivation of a photovoltaic device. As will be appreciated, these techniques may also be employed for surface passivation of other devices, such as not limited to, bifacial photovoltaic devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A photovoltaic device comprising:
    a photovoltaic cell comprising:
        an emitter layer comprising a crystalline semiconductor material;
        a lightly doped crystalline substrate disposed adjacent the emitter layer, wherein the lightly doped crystalline substrate and the emitter layer are oppositely doped; and wherein the lightly doped crystalline substrate comprises a single crystal or a poly crystal semiconductor material; and
    a back surface passivated structure comprising:
        a highly doped back surface field layer disposed adjacent the lightly doped crystalline substrate wherein the highly doped back surface field layer comprises a doped amorphous or a doped microcrystalline semiconductor material, wherein the highly doped back surface field layer and the lightly doped crystalline substrate are similarly doped, and wherein a doping level of the highly doped back surface field layer is higher than a doping level of the lightly doped crystalline substrate.

2. The photovoltaic device of claim 1, further comprising an intrinsic back surface passivated layer disposed adjacent the lightly doped crystalline substrate, wherein the intrinsic back surface passivated layer comprises an amorphous or microcrystalline semiconductor material, and wherein the intrinsic back surface passivated layer is configured to provide a surface passivation, or reduce a potential barrier for an electron or a hole traversing from the lightly doped crystalline substrate to the highly doped back surface field layer, or facilitate tunneling of an electron or a hole generated in the lightly doped crystalline substrate to the highly doped back surface field layer, or combinations thereof.

3. The photovoltaic device of claim 2, wherein a thickness of the intrinsic back surface passivated layer is in a range from about 1 nm to about 30 nm.

4. The photovoltaic device of claim 1, further comprising a dielectric layer disposed adjacent the emitter layer, wherein the dielectric layer is configured to provide a surface passivation, or an anti-reflection coating, or both.

5. The photovoltaic device of claim 4, wherein the dielectric layer comprises silicon nitride, silicon oxide, silicon oxynitride, magnesium flouride, aluminum oxide, titanium oxide, zirconium oxide, or combinations thereof.

6. The photovoltaic device of claim 5, wherein a metal contact electrode is disposed on the dielectric layer.

7. The photovoltaic device of claim 1, wherein an activation energy of the highly doped back surface field layer is in a range from about 0.08 eV to about 1.0 eV.

8. The photovoltaic device of claim 1, further comprising a transparent conductive layer disposed adjacent the highly doped back surface field layer.

9. The photovoltaic device of claim 1, further comprising a reflective back contact layer disposed adjacent the highly doped back surface field layer or the transparent conductive layer.

10. The photovoltaic device of claim 1, wherein the photovoltaic device comprises a solar cell.

11. A photovoltaic device having a front side and a back side, comprising:
    a photovoltaic cell comprising:
        an emitter layer comprising a crystalline semiconductor material;
        a lightly doped crystalline substrate disposed adjacent the emitter layer, wherein the lightly doped crystalline substrate and the emitter layer are oppositely doped; and wherein the lightly doped crystalline substrate comprises a single crystal or a poly crystal semiconductor material;

a back surface passivated structure comprising:
   an intrinsic back surface passivated layer disposed adjacent the lightly doped crystalline substrate, wherein the intrinsic back surface passivated layer comprises an amorphous or a microcrystalline semiconductor material, and wherein the intrinsic back surface passivated layer is configured to provide a surface passivation, or reduce a potential barrier for an electron or a hole traversing from the lightly doped crystalline substrate to the highly doped back surface field layer, or both; and
   a highly doped back surface field layer disposed adjacent the intrinsic back surface passivated layer, wherein the highly doped back surface field layer comprises a doped amorphous or a doped microcrystalline semiconductor material, wherein the highly doped back surface field layer and the lightly doped crystalline substrate are similarly doped, and wherein a doping level of the highly doped back surface field layer is higher than a doping level of the lightly doped crystalline substrate.

12. The photovoltaic device of claim 11, wherein the intrinsic back surface passivated layer is configured to facilitate tunneling of an electron or a hole generated in the lightly doped crystalline substrate to the highly doped back surface field layer.

13. The photovoltaic device of claim 11, further comprising a dielectric layer disposed on the front side of the photovoltaic device and adjacent the emitter layer.

14. The photovoltaic device of claim 11, wherein a doping level of the emitter layer is in a range from about $1 \times 10^{17}$ cm$^{-3}$ to about $1 \times 10^{21}$ cm$^{-3}$.

15. The photovoltaic device of claim 14, wherein the doping level of the emitter layer is in a range from about $1 \times 10^{19}$ cm$^{-3}$ to about $3 \times 10^{20}$ cm$^{-3}$.

16. The photovoltaic device of claim 11, wherein an activation energy of the highly doped back surface field layer is in a range from about 0.08 eV to about 1.0 eV.

17. The photovoltaic device of claim 11, wherein the intrinsic back surface passivated layer has a variable thickness such that the lightly doped crystalline substrate makes a point contact, or a line contact, or both with the highly doped back surface field layer.

18. The surface passivated photovoltaic device of claim 17, wherein the variable thickness of the intrinsic back surface passivated layer is in a range from about 1 nm to about 5 nm.

19. A device comprising:
   a first structure comprising an emitter layer and a crystalline substrate, wherein the emitter layer and the crystalline substrate are oppositely doped and ranged to form a p-n junction, and wherein the emitter layer comprises a crystalline semiconductor material; and
   a second structure comprising the crystalline substrate and a highly doped back surface field layer, wherein the highly doped back surface field layer comprises an amorphous or a microcrystalline semiconductor material, wherein the highly doped back surface field layer is similarly doped as the crystalline substrate and wherein the highly doped back surface field layer and the crystalline substrate are arranged to form a heterojunction, and wherein a doping level of the highly doped back surface field layer is higher than a doping level of the crystalline substrate.

20. The device of claim 19, further comprising an intrinsic layer disposed between the crystalline substrate and the highly doped back surface field layer, wherein the intrinsic layer comprises an amorphous or a microcrystalline semiconductor material, wherein the intrinsic layer is configured to provide a surface passivation, or reduce a potential barrier for an electron or a hole traversing from the crystalline substrate to the highly doped back surface field layer, or facilitate tunneling of the electron or the hole from the crystalline substrate to the highly doped back surface field layer, or combinations thereof.

21. The device of claim 19, wherein an activation energy or an ionization energy of the highly doped back surface field layer is in a range from about 0.08 eV to about 1.0 eV.

22. The device of claim 19, wherein the doping level of the crystalline substrate is in a range from about $1 \times 10^{14}$ cm$^{-3}$ to about $5 \times 10^{16}$ cm$^{-3}$.

23. The device of claim 19, further comprising a dielectric layer disposed on the front side and adjacent the emitter layer.

24. The device of claim 19, wherein the emitter layer comprises a p-doped layer, the crystalline substrate comprises a n-doped substrate, and the highly doped back surface field layer comprises a n$^+$-doped layer.

25. The device of claim 19, wherein the emitter layer comprises a n-doped layer, the crystalline substrate comprises a p-doped substrate, and the highly doped back surface field layer comprises a p$^+$-doped layer.

26. The device of claim 19, wherein the emitter layer, the crystalline substrate, and the highly doped back surface field layer comprise a silicon-based material.

27. The device of claim 19, wherein a bandgap of the highly doped back surface field layer is higher than a bandgap of the crystalline substrate.

* * * * *